US009465073B2

(12) United States Patent
Kim

(10) Patent No.: US 9,465,073 B2
(45) Date of Patent: Oct. 11, 2016

(54) INTEGRATED CIRCUIT (IC) FOR RECONSTRUCTING VALUES OF FLIP-FLOPS CONNECTED IN A SCAN-CHAIN BY USING A JOINT TEST ACTION GROUP (JTAG) INTERFACE, A METHOD OF OPERATING THE IC, AND DEVICES HAVING THE IC

(71) Applicant: SAMSUNG ELECTRONICS CO., LTD., Suwon-Si, Gyeonggi-Do (KR)

(72) Inventor: Bum Ju Kim, Hwangseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 78 days.

(21) Appl. No.: 14/456,341

(22) Filed: Aug. 11, 2014

(65) Prior Publication Data

US 2015/0067425 A1     Mar. 5, 2015

(30) Foreign Application Priority Data

Sep. 2, 2013    (KR) .......................... 10-2013-0104710

(51) Int. Cl.
*G01R 31/317*      (2006.01)
*G01R 31/3177*     (2006.01)
*G01R 31/3185*     (2006.01)

(52) U.S. Cl.
CPC . *G01R 31/318555* (2013.01); *G01R 31/31705* (2013.01); *G01R 31/318536* (2013.01); *G01R 31/318597* (2013.01); *G01R 31/3177* (2013.01); *G01R 31/318558* (2013.01)

(58) Field of Classification Search
CPC .............. G01R 31/318536; G01R 31/318555; G01R 31/31705; G01R 31/3177; G01R 31/318533; G01R 31/318597

USPC ......................................................... 714/727
See application file for complete search history.

(56) References Cited

U.S. PATENT DOCUMENTS

| | | | | |
|---|---|---|---|---|
| 5,621,739 A | * | 4/1997 | Sine ........................ | G01R 31/30 714/724 |
| 5,627,840 A | * | 5/1997 | Hundertmark . | G01R 31/318547 714/724 |
| 5,805,608 A | * | 9/1998 | Baeg ................... | G01R 31/2884 714/726 |
| 5,812,562 A | | 9/1998 | Baeg | |
| 5,898,704 A | * | 4/1999 | Kawano ......... | G01R 31/318558 714/727 |
| 6,018,815 A | * | 1/2000 | Baeg ................ | G01R 31/31705 365/201 |
| 6,157,210 A | | 12/2000 | Zaveri et al. | |
| 6,353,905 B1 | | 3/2002 | Noguchi | |

(Continued)

FOREIGN PATENT DOCUMENTS

| | | |
|---|---|---|
| JP | 2000-131389 | 5/2000 |
| JP | 2008-164470 | 7/2008 |
| KR | 100273280 | 9/2000 |

*Primary Examiner* — James C Kerveros
(74) *Attorney, Agent, or Firm* — F. Chau & Associates, LLC

(57) ABSTRACT

An integrated circuit (IC) includes an on-chip logic that includes an input terminal, an output terminal, and a plurality of synchronizing circuits connected in a scan-chain; a test data in (TDI) line; a test data out (TDO) line connected to the output terminal; and a test access port (TAP) controller that transmits, to the input terminal, data output from one of a plurality of data sources, the data sources including the TDI line and the output terminal, in response to one or more selection signals.

18 Claims, 11 Drawing Sheets

(56) References Cited

U.S. PATENT DOCUMENTS

| | | | |
|---|---|---|---|
| 7,219,265 B2* | 5/2007 | Yee | G06F 11/267 |
| | | | 714/30 |
| 7,284,175 B2 | 10/2007 | Wang et al. | |
| 7,412,624 B1 | 8/2008 | Draper | |
| 7,644,333 B2* | 1/2010 | Hill | G01R 31/318547 |
| | | | 714/726 |
| 8,108,742 B2 | 1/2012 | Whetsel | |
| 2004/0250185 A1 | 12/2004 | Date | |
| 2007/0118780 A1* | 5/2007 | Whetsel | G01R 31/318555 |
| | | | 714/726 |
| 2009/0013226 A1* | 1/2009 | Swoboda | G01R 31/318536 |
| | | | 714/726 |
| 2009/0113264 A1* | 4/2009 | Seibold | G01R 31/318544 |
| | | | 714/727 |
| 2013/0086441 A1* | 4/2013 | Yang | G01R 31/318555 |
| | | | 714/727 |
| 2013/0139015 A1* | 5/2013 | Vaccaro | G01R 31/318558 |
| | | | 714/727 |

* cited by examiner

FIG. 6

| PATH | SEL1 | SEL2 | SEL3 |
|---|---|---|---|
| PATH1 | 1 | 0 | 0 |
| PATH2 | 1 | 1 | 0 |
| PATH3 | 1 | 0 | 1 |
| PATH4 | 0 | × | × |

INTEGRATED CIRCUIT (IC) FOR RECONSTRUCTING VALUES OF FLIP-FLOPS CONNECTED IN A SCAN-CHAIN BY USING A JOINT TEST ACTION GROUP (JTAG) INTERFACE, A METHOD OF OPERATING THE IC, AND DEVICES HAVING THE IC

CROSS-REFERENCE TO RELATED APPLICATION

This application claims priority under 35 U.S.C. §119(a) to Korean Patent Application No. 10-2013-0104710 filed on Sep. 2, 2013, the disclosure of which is incorporated by reference herein in its entirety.

TECHNICAL FIELD

The inventive concept relates to an integrated circuit (IC) including a Joint Test Action Group Test Access Port (JTAG TAP) controller.

DISCUSSION OF THE RELATED ART

JTAG is a general term for the IEEE 1149.1 Standard Test Access Port and Boundary-Scan Architecture. JTAG was initially devised for testing printed circuit boards using boundary scan and is still used for this application. JTAG is also used for IC debug ports.

SUMMARY

According to an exemplary embodiment of the inventive concept, there is provided an integrated circuit (IC) including an on-chip logic that includes an input terminal, an output terminal, and a plurality of synchronizing circuits connected in a scan-chain; a test data in (TDI) line; a test data out (TDO) line connected to the output terminal; and a test access port (TAP) controller that transmits, to the input terminal, data output from one of a plurality of data sources, the data sources including the TDI line and the output terminal, in response to one or more selection signals.

The IC may further include a mask circuit that controls a connection between the TDO line and a TDO pin based on a control signal output from a programmable memory (PM).

According to an exemplary embodiment of the inventive concept, the TAP controller may invert the data output from the output terminal, and may feed the inverted data back to the input terminal. According to an exemplary embodiment of the inventive concept, the TAP controller may include a register block that stores user-defined data, and the data sources may further include the register block. According to an exemplary embodiment of the inventive concept, the TAP controller may change a part of the data output from the output terminal to the user-defined data. According to an exemplary embodiment of the inventive concept, the TAP controller may include one or more registers that store one or more programmable selection signals.

According to an exemplary embodiment of the inventive concept, when the one selection signal is a first selection signal, the TAP controller may include a selection circuit that controls a connection between the input terminal and one of the TDI line and the output terminal based on the first selection signal. According to an exemplary embodiment of the inventive concept, when the selection signals include a first selection signal and a second selection signal and a first inverter is disposed between a last synchronizing circuit from among the plurality of synchronizing circuits and the output terminal, the TAP controller may include a second inverter connected to the output terminal, a second selection circuit that outputs the data output from the output terminal or output data of the second inverter based on the second selection signal, and a first selection circuit that controls a connection between the input terminal and one of the TDI line and an output terminal of the second selection circuit, based on the first selection signal.

According to an exemplary embodiment of the inventive concept, when the selection signals include a first selection signal and a second selection signal, the TAP controller may include a register block that stores user-defined data, a second selection circuit that outputs the data output from the output terminal or the user-defined data based on the second selection signal, and a first selection circuit that controls a connection between the input terminal and one of the TDI line and an output terminal of the second selection circuit based on the first selection signal.

According to an exemplary embodiment of the inventive concept, the TAP controller may include a change data register that stores change data associated with changing a part of the data output from the output terminal to the user-defined data when a change occurs; a counter that counts a cycle of a test clock (TCK) signal provided to the on-chip logic via a Joint Test Action Group (JTAG) interface and outputs a count value corresponding to a result of the counting; a comparator that compares a reference value associated with the change data with the count value and outputs a flag corresponding to a result of the comparison; a register that stores control data about the second selection circuit; and a selection signal generator that generates the second selection signal by performing a logic operation on the flag and the control data.

According to an exemplary embodiment of the inventive concept, when the selection signals include a first selection signal, a second selection signal, and a third selection signal, the TAP controller includes a register block, that stores user-defined data, a third selection circuit that outputs the data output from the output terminal or the user-defined data based on the third selection signal, an inverter connected to an output terminal of the third selection circuit, a second selection circuit that outputs output data of the third selection circuit or output data of the inverter based on the second selection signal, and a first selection circuit that controls a connection between the input terminal and one of the TDI line and an output terminal of the second selection circuit based on the first selection signal.

According to an exemplary embodiment of the inventive concept, the TAP controller may include a change data register that stores change data associated with changing a part of the data output from the output terminal to the user-defined data when a change occurs; a counter that counts a cycle of a TCK signal provided to the on-chip logic via a JTAG interface and outputs a count value corresponding to a result of the counting; a comparator that compares a reference value associated with the change data with the count value and outputs a flag corresponding to a result of the comparison; a register that stores control data about the second selection circuit; and a selection signal generator that generates the third selection signal by performing a logic operation on the flag and the control data.

According to an exemplary embodiment of the inventive concept, there is provided an application processor (AP) that may include the IC.

According to an exemplary embodiment of the inventive concept, there is provided a computer system that may include an AP, a memory that communicates with the AP, a display that communicates with the AP, wherein the AP may include a central processing unit (CPU), a memory interface that communicates with the memory under the control of the CPU, and a display controller that controls an operation of the display under the control of the CPU.

The CPU may include an on-chip logic that includes an input terminal, an output terminal, and a plurality of synchronizing circuits connected in a scan-chain; a TDI line; a TDO line connected to the output terminal; and a TAP controller that connects one of a plurality of data sources, the data sources including the TDI line and the output terminal, to the input terminal in response to one or more selection signals.

The CPU may include a mask circuit that controls a connection between the TDO line and a TDO pin based on a control signal output from a PM.

According to an exemplary embodiment of the inventive concept, when the selection signals comprise a first selection signal, a second selection signal, and a third selection signal, the TAP controller may include: a register block that stores user-defined data; a third selection circuit that outputs output data of the output terminal or the user-defined data based on the third selection signal; an inverter connected to an output terminal of the third selection circuit; a second selection circuit that outputs output data of the third selection circuit or output data of the inverter based on the second selection signal; and a first selection circuit that controls a connection between the input terminal and one of the TDI line and an output terminal of the second selection circuit based on the first selection signal.

According to an exemplary embodiment of the inventive concept, the TAP controller may include: a change data register that stores change data associated with changing a part of the output data of the output terminal to the user-defined data when a change occurs; a counter that counts a cycle of a TCK signal provided to the on-chip logic via a JTAG interface and outputs a count value corresponding to a result of the counting; a comparator that compares a reference value associated with the change data with the count value and outputs a flag corresponding to a result of the comparison; a register that stores control data about the second selection circuit; and a selection signal generator that generates the third selection signal by performing a logic operation on the flag and the control data.

According to an exemplary embodiment of the inventive concept, the TAP controller may include a register block that stores user-defined data, and the plurality of data sources further comprise the register block.

According to an exemplary embodiment of the inventive concept, the TAP controller may change a part of output data of the output terminal to the user-defined data.

According to an exemplary embodiment of the inventive concept, there is provided a method of operating the IC, the IC including an on-chip logic that includes an input terminal, an output terminal connected to a TDO line, and a plurality of synchronizing circuits connected in a scan-chain. The method includes setting a plurality of selection signals; and connecting to the input terminal one of a first path that transmits TDI data received via a TDI line, a second path that transmits data associated with output data of the output terminal, and a third path that transmits user-defined data, in response to the plurality of selection signals.

A phase of data associated with the output data fed back to the input terminal via the second path may be the same as or different from that of the output data of the output terminal. The method may further include changing a part of data associated with the output data fed back to the input terminal to the user-defined data by using the third path.

According to an exemplary embodiment of the inventive concept, there is provided an IC including an on-chip logic including an input terminal and a plurality of sequentially connected circuits; and a test access port controller configured to transmit test data, output data of the on-chip logic or user-data to the input terminal in response to one or more selection signals.

The on-chip logic may include flip-flops.

The test data may be received at a JTAG interface.

BRIEF DESCRIPTION OF THE DRAWINGS

Exemplary embodiments of the inventive concept will be more clearly understood from the following detailed description taken in conjunction with the accompanying drawings in which:

FIG. 6 is a table showing selection conditions of signal paths illustrated in FIG. 4, according to an exemplary embodiment of the inventive concept;

DETAILED DESCRIPTION OF THE EMBODIMENTS

Figure 1:
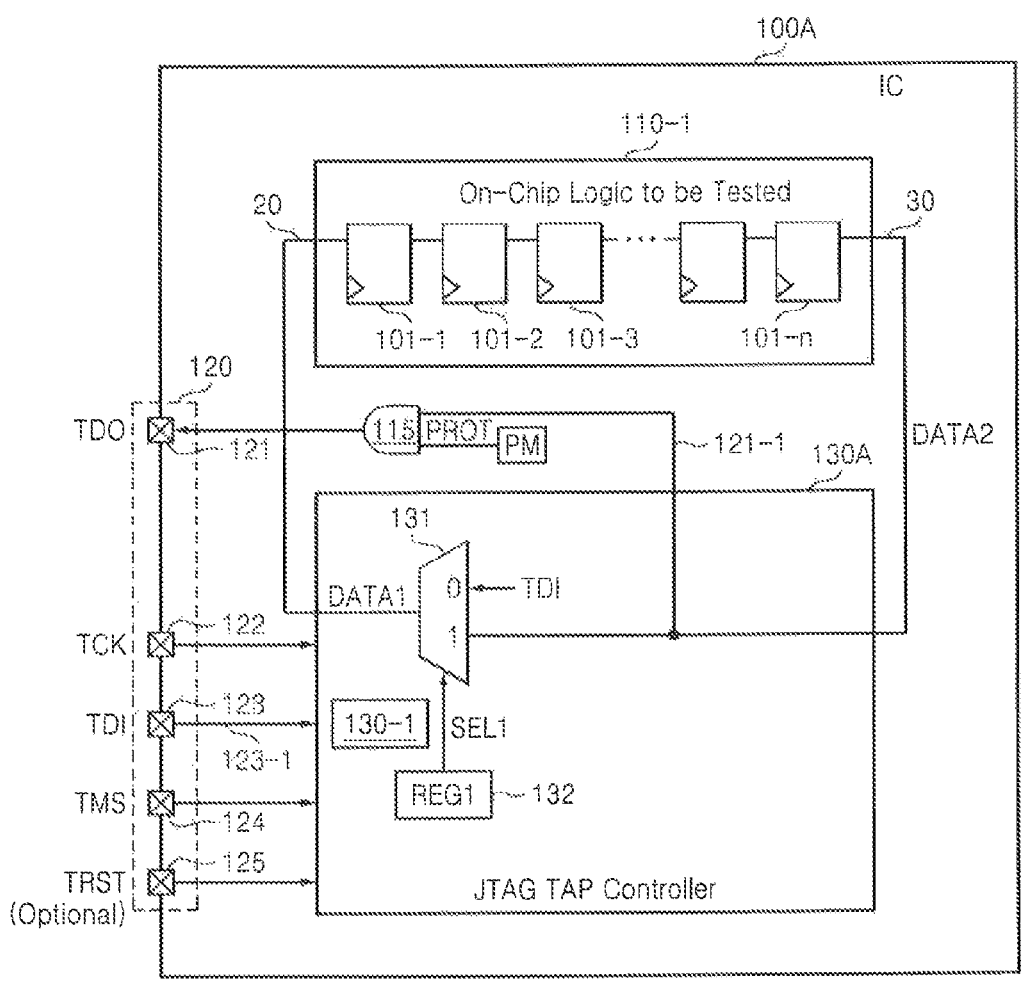
FIG. 1 is a block diagram of an integrated circuit (IC) including a Joint Test Action Group Test Access Port (JTAG TAP) controller, according to an exemplary embodiment of the inventive concept.

FIG. 1 is a block diagram of an integrated circuit (IC) 100A including a Joint Test Action Group Test Access Port (JTAG TAP) controller 130A, according to an exemplary embodiment of the inventive concept. Referring to FIG. 1, the IC 100A includes a to-be-tested on-chip logic 110-1, a JTAG interface 120, and the JTAG TAP controller 130A. The IC 100A may be a system on chip (SoC).

The to-be-tested on-chip logic 110-1, which is to be debugged, may be referred to as a core logic or a unit under test (UUT).

The to-be-tested on-chip logic 110-1 may include an input terminal 20, an output terminal 30, and a plurality of synchronizing circuits 101-1 through 101-n (where n is a natural number) connected in a single scan-chain. Each of the sequentially-connected synchronizing circuits 101-1 through 101-n may denote a scan flip-flop or a flip-flop. An output terminal of a current scan flip-flop is connected to an input terminal of a next scan flip-flop.

In a scan test mode and/or a scan dump mode, a current scan flip-flop may transmit a stored value to a next scan flip-flop based on a test clock (TCK) signal TCK and a test mode select (TMS) signal TMS. Each scan flip-flop may include an input terminal and an output terminal, and a combinational logic may exist between an output terminal of a current scan flip-flop and an input terminal of a next scan flip-flop.

Each of the synchronizing circuits 101-1 through 101-n is a digital circuit that operates in synchronization with the TCK signal TCK, and may be implemented by using a flip-flop or a scan flip-flop. For example, each of the synchronizing circuits 101-1 through 101-n may operate based on the TCK signal TCK and the TMS signal TMS.

The JTAG interface 120 is a four-pin interface or five-pin interface added to the IC 100A. The JTAG interface 120 includes a test data out (TDO) pin 121, a TCK pin 122, a test data in (TDI) pin 123, and a TMS pin 124. Optionally, the JTAG interface 120 may further include a test reset (TRST) pin 125. The pins 121 through 125 of the JTAG interface 120 and a signal input and output via each of the pins 121 through 125 are transited by way of the IEEE 1149.1 standard.

The term 'pin' used herein may denote a conductor or an electric lead.

The JTAG TAP controller 130A may control an operation of the to-be-tested on-chip logic 110-1 by using a TDO signal TDO, the TCK signal TCK, a TDI signal TDI, and the TMS signal TMS (and optionally, a TRST signal TRST).

The JTAG TAP controller 130A includes a control logic 130-1, a first selection circuit 131, and a first register 132. The output terminal 30 of the to-be-tested on-chip logic 110-1 may be connected to the TDO pin 121 via a TDO line 121-1 and a mask circuit 115.

For example, the mask circuit 115 may control a connection between the TDO line 121-1 and the TDO pin 121, based on the level of a control signal PROT output from a programmable memory (PM). According to an exemplary embodiment of the inventive concept, the mask circuit 115 and the PM may be implemented inside or outside the JTAG TAP controller 130A. For example, the mask circuit 115 may be implemented by using an AND gate. The PM may be implemented by using a one-time programmable (OTP) cell, a fuse, an anti-fuse, or an e-fuse.

For example, when the PM is programmed so that a control signal PROT having a high level (or data of 1) may be output, a signal output from the output terminal 30 of the to-be-tested on-chip logic 110-1 may be output to the outside via the TDO pin 121. However, when the PM is programmed so that a control signal PROT having a low level (or data of 0) may be output, the signal output from the output terminal 30 of the to-be-tested on-chip logic 110-1 may not be output to the outside via the TDO pin 121.

For example, a manufacturer may program the PM so that the control signal PROT having the low level may be output, to prevent internal circuits of the IC 100A from being disclosed (or open). Since the signal output by the output terminal 30 of the to-be-tested on-chip logic 110-1 is not output via the TDO pin 121, data stored in the to-be-tested on-chip logic 110-1 in a scan dump mode of the IC 100A is not monitored via the TDO pin 121.

A JTAG TAP controller 130A, 130B, 130C, 130D, or 130E according to an exemplary embodiment of the inventive concept shown in FIGS. 1-4 and 7 includes a register 132, 135, 130-1C, 130-1D, 130-1E, and/or 130-3 capable of previously storing necessary data.

Thus, the JTAG TAP controller 130A, 130B, 130C, 130D, or 130E may debug the IC 100A by using the register 132, 135, 130-1C, 130-1D, 130-1E, and/or 130-3, without monitoring a signal output by the output terminal 30 via the TDO pin 121 during a test of the to-be-tested on-chip logic 110-1 or inputting new data to the to-be-tested on-chip logic 110-1.

In addition, when a debugging is not properly performed due to a malfunction of an internal circuit of the IC 100A, the JTAG TAP controller 130A, 130B, 130C, 130D, or 130E may directly change the data input to parts suspected to have a malfunction or parts in which debugging is not properly performed by using the register 132, 135, 130-1C, 130-1D, 130-1E, and/or 130-3, without having to forcibly output the values stored in all of the internal registers of the IC 100A to the outside, thereby finding the cause of the malfunction and/or the reason why the debugging is not properly performed.

The control logic 130-1 may set (or program) data associated with the generation of a first selection signal SEL1 in the first register 132 by using the signals TCK, TDI, and/or TMS input via the JTAG interface 120.

The first selection circuit 131 may transmit, as a first signal DATA1, the TDI signal TDI input via a TDI line 123-1 or a second signal DATA2 output by the output terminal 30 to the input terminal 20, based on the first selection signal SEL1 output by the first register 132. Here, 'signal' may denote digital signals including one or more bits, and may be referred to as data.

For example, when the first selection signal SEL1 is at a high level (for example, data '1'), the first selection circuit 131 feeds back (or re-loads), as first data DATA1, second data DATA2 output by the output terminal 30 to the input terminal 20. When the first selection signal SEL1 is at a low level (for example, data '0'), the first selection circuit 131 transmits the TD signal TDI as the first data DATA1 to the input terminal 20. The TDI line 123-1 and the output terminal 30 may function as data sources.

Figure 2:
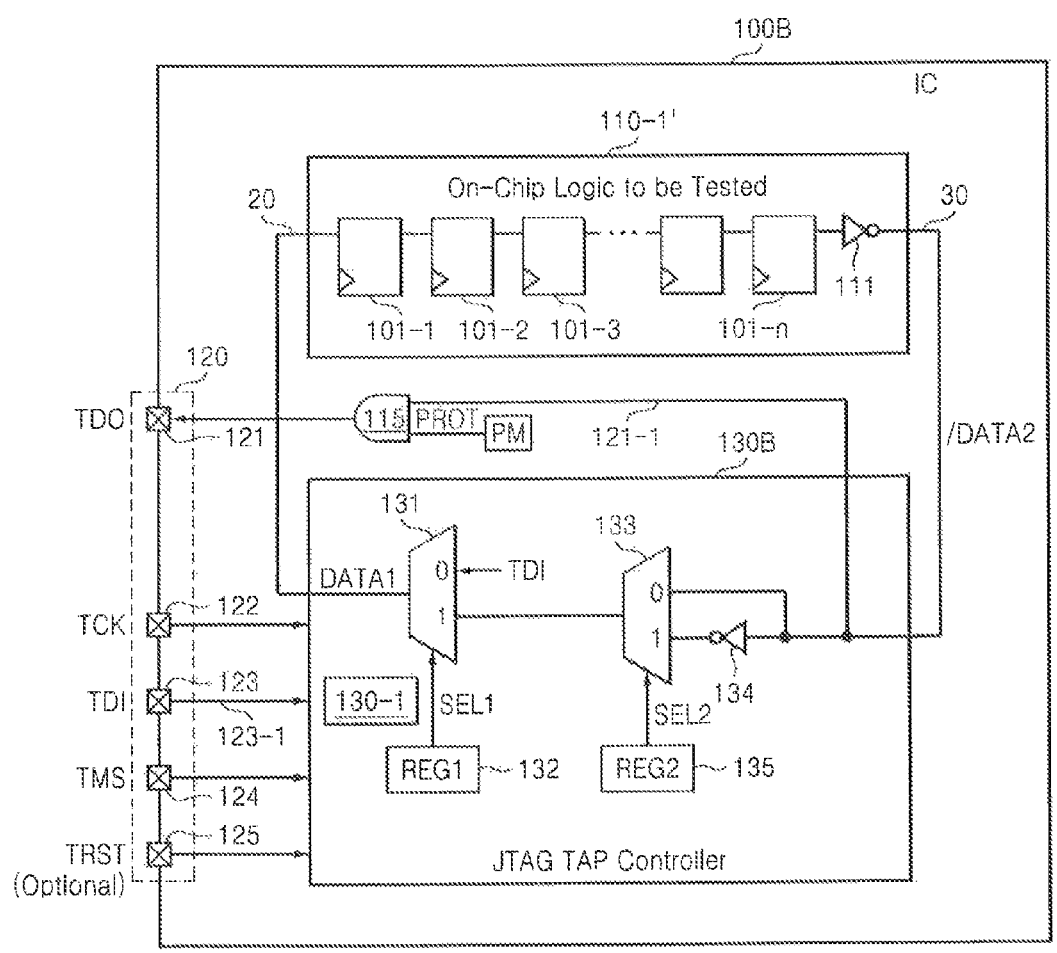
FIG. 2 is a block diagram of an IC including a JTAG TAP controller, according to an exemplary embodiment of the inventive concept.

FIG. 2 is a block diagram of an IC 100B including the JTAG TAP controller 130B, according to an exemplary embodiment of the inventive concept. Referring to FIG. 2, the IC 100B includes a to-be-tested on-chip logic 110-1', a JTAG interface 120, and the JTAG TAP controller 130B. The IC 100B may denote a SoC.

The to-be-tested on-chip logic 110-1' includes an input terminal 20, an output terminal 30, a plurality of synchronizing circuits 101-1 through 101-n connected in a scan-chain, and a first inverter 111.

The first inverter 111 inverts an output signal of the last synchronizing circuit 101-n from among the synchronizing circuits 101-1 through 101-n, and outputs inverted second data /DATA2 to the JTAG TAP controller 130E via the output terminal 30. The JTAG TAP controller 130B may control an operation of the to-be-tested on-chip logic 110-1' by using a TDO signal TDO, a TCK signal TCK a TDI signal TDI, and a TMS signal TMS (and optionally, a TRST signal TRST).

The JTAG TAP controller 130B includes a control logic 130-1, a first selection circuit 131, a first register 132, a second selection circuit 133, a second inverter 134, and a second register 135.

The output terminal 30 of the to-be-tested on-chip logic 110-1' is connected to a TDO pin 121 via a TDO line 121-1 and a mask circuit 115. Respective functions and operations of the mask circuit 115 and a PM of FIG. 2 are the same as those described above with reference to FIG. 1.

By using the signals TCK, TDI, and/or TMS input via the JTAG interface 120, the control logic 130-1 may set data associated with the generation of a first selection signal SEL1 in the first register 132 and may set data associated with the generation of a second selection signal SEL2 in the second register 135.

The second selection circuit 133 outputs the inverted second data /DATA2 or second data DATA2 that is output by the second inverter 134, to the first selection circuit 131, based on the second selection signal SEL2 output by the second register 135.

The first selection circuit 131 transmits, as first data DATA1, the TDI signal TDI received via a TDI line 123-1 or the inverted or non-inverted second data /DATA2 or DATA2 output from the second selection circuit 133, to the input terminal 20, based on the first selection signal SEL1 output from the first register 132.

For example, when the second selection signal SEL2 is at a high level, the second selection circuit 133 outputs the second data DATA2 output from the second inverter 134 to the first selection circuit 131, and when the second selection signal SEL2 is at a low level, the second selection circuit 133 outputs the inverted second data /DATA2 to the first selection circuit 131.

According to whether the first inverter 111 is included in the to-be-tested on-chip logic 110-1', the second selection circuit 133 may output the inverted second data /DATA2 or the second data DATA2 to the first selection circuit 131 based on the second selection signal SEL2.

Figure 3:
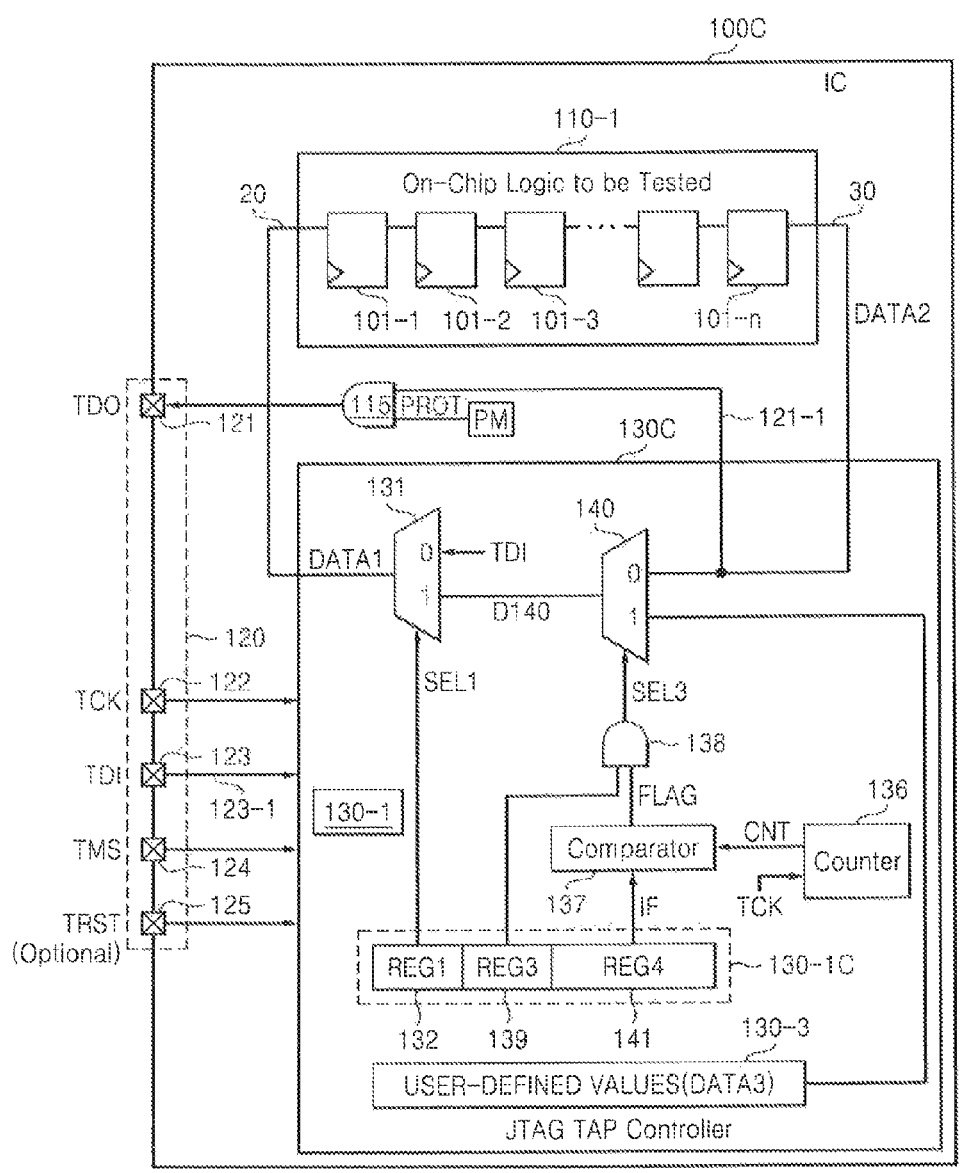
FIG. 3 is a block diagram of an IC including a JTAG TAP controller, according to an exemplary embodiment of the inventive concept.

FIG. 3 is a block diagram of an IC 100C including the JTAG TAP controller 130C, according to an exemplary embodiment of the inventive concept. Referring to FIG. 3, the IC 100C includes a to-be-tested on-chip logic 110-1, a JTAG interface 120, and the JTAG TAP controller 130C. The IC 100C may denote a SoC.

The JTAG TAP controller 130C may control an operation of the to-be-tested on-chip logic 110-1 by using a TDO signal TDO, a TCK signal TCK, a TDI signal TDI, and a TMS signal TMS (and optionally, a TRST signal TRST).

The JTAG TAP controller 130C includes a control logic 130-1, a first register block 130-1C, a second register block 130-3, a counter 136, a comparator 137, a logic circuit 138, and a third selection circuit 140.

By using the signals TCK, TDI, and/or TMS received via the JTAG interface 120, the control logic 130-1 may set data associated with the generation of a first selection signal SEL1 in a first register 132, may set data associated with the generation of a third selection signal SEL3 in a third register 139, and may set change data IF that represents at least one of a size and position of data that is to be changed (or to be replaced), in a fourth register 141.

The first register block 130-1C includes the first register 132, the third register 139, and the fourth register 141. Each of the first, third, and fourth registers 132, 139, and 141 may store one or more bits.

The control logic 130-1 may store user-defined data, for example, third data DATA3, in the second register block 130-3 by using the signals TCK, TDI, and/or TMS received via the JTAG interface 120. The second register block 130-3 may store one or more bits, and may function as a data source.

For example, the third data DATA3 may be data that is to be secured. A size of the third data DATA3 may be smaller than or equal to that of second data DATA2. The counter 136 counts a cycle of the TCK signal TCK provided to the to-be-tested on-chip logic 110-1 via the JTAG interface 120, and outputs a count value CNT corresponding to a result of the counting. In other words, the counter 136 may count a cycle (or period) of the TCK signal TCK while a shift operation is being performed in the to-be-tested on-chip logic 110-1, and may output a count value CNT corresponding to a result of the counting.

The comparator 137 may compare a reference value associated with the change data IF output by the fourth register 141 with the count value CNT, and may output a flag FLAG of which a level is determined according to a result of the comparison.

The logic circuit 138 performs a logical operation on the flag FLAG and control data stored in the third register 139, and outputs a third selection signal SEL3 corresponding to a result of the logical operation. For example, the logic circuit 138 may perform the function of a selection signal generator that generates the third selection signal SEL3, and may be implemented by using an AND gate.

The third selection circuit 140 transmits, as output data D140, one of the second data DATA2 of the output terminal 30 and the third data DATA3 of the second register block 130-3, to a first selection circuit 131, in response to the third selection signal SEL3.

The first selection circuit 131 transmits, as first data DATA1, a TDI signal TDI received via a TDI line 123-1 or the output data D140 of the third selection circuit 140, to the input terminal 20, based on the first selection signal SEL1 output by the first register 132.

According to an activation timing and deactivation timing of the third selection signal SEL3, a part of the second data DATA2 of the output terminal 30 may be changed to the third data DATA3.

A process in which the part of the second data DATA2 output by the output terminal 30 is changed to the third data DATA3 will be described in detail with reference to FIG. 5.

The output terminal 30 of the to-be-tested on-chip logic 110-1 is connected to a TDO pin 121 via a TDO line 121-1 and a mask circuit 115. Respective functions and operations of the mask circuit 115 and a PM of FIG. 3 are the same as those described with reference to FIG. 1.

Figure 4:
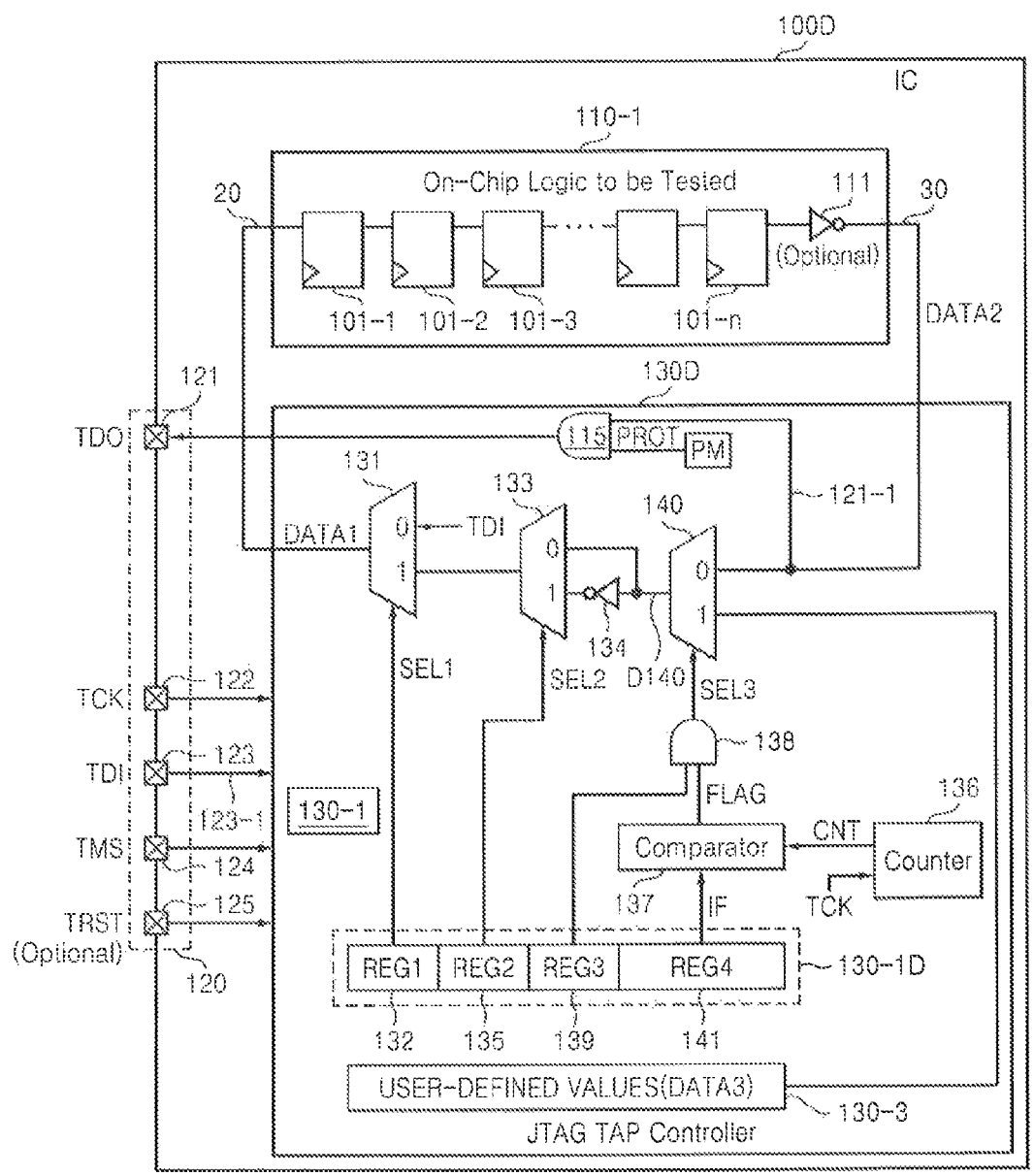
FIG. 4 is a block diagram an IC including a JTAG TAP controller, according to an exemplary embodiment of the inventive concept.

FIG. 4 is a block diagram of an IC 100D including the JTAG TAP controller 130D, according to an exemplary embodiment of the inventive concept. Referring to FIG. 4, the IC 100D includes a to-be-tested on-chip logic 110-1, a JTAG interface 120, and the JTAG TAP controller 130D. The IC 100D may denote a SoC.

The JTAG TAP controller 130D may control a scan operation of the to-be-tested on-chip logic 110-1 by using a TDO signal TDO, a TCK signal TCK, a TDI signal TDI, and a TMS signal TMS (and optionally, a TRST signal TRST). According to an exemplary embodiment of the inventive concept, the to-be-tested on-chip logic 110-1 may or may not include a first inverter 111.

For example, when the to-be-tested on-chip logic 110-1 includes the first inverter 111, a second selection signal SEL2 may be set to a high level. However, when the to-be-tested on-chip logic 110-1 does not include the first inverter 111, the second selection signal SEL2 may be set to a low level.

The JTAG TAP controller 130D may make a phase of first data DATA1 fed back to an input terminal 20 of the to-be-tested on-chip logic 110-1 be the same as that of second data DATA2 or /DATA2 output by an output terminal 30 of the to-be-tested on-chip logic 110-1. The JTAG TAP controller 130D may also determine a level of the second selection signal SEL2 to make the phase of the first data DATA1 fed back to the input terminal 20 of the to-be-tested on-chip logic 110-1 be different from that of the second data DATA2 or /DATA2 output by the output terminal 30 of the to-be-tested on-chip logic 110-1.

The JTAG TAP controller 130D includes a control logic 130-1, a first register block. 130-1D, a second register block 130-3, a first selection circuit 131, a second selection circuit 133, a second inverter 134, a counter 136, a comparator 137, a logic circuit 138, and a third selection circuit 140.

By using the signals TCK, TDI, and/or TMS received via the JTAG interface 120, the control logic 130-1 may set data associated with the generation of a first selection signal SEL1 into a first register 132, may set data associated with the generation of the second selection signal SEL2 into a second register 135, may set data associated with the generation of a third selection signal SEL3 into a third register 139, and may set in a fourth register 141 change data that represents at least one of a size and position of data that is to be changed (or to be replaced).

The first register block 130-1D includes the first register 132, the second register 135, the third register 139, and the fourth register 141. Each of the first, second, third, and fourth registers 132, 135, 139, and 141 may store one or more bits.

The control logic 130-1 may store user-defined data, for example, third data DATA3, in the second register block 130-3 by using the signals TCK, TDI, and/or TMS received via the JTAG interface 120. The counter 136 counts a cycle of the TCK signal TCK provided to the to-be-tested on-chip logic 110-1 via the JTAG interface 120, and outputs a count value CNT corresponding to a result of the counting.

The comparator 137 compares a reference value corresponding to change data IF stored in the fourth register 141 with the count value CNT, and outputs a flag FLAG corresponding to a result of the comparison. The logic circuit 138 performs a logical operation on the flag FLAG and control data output by the third register 139, and outputs a third selection signal SEL3 corresponding to a result of the logical operation.

The third selection circuit 140 transmits, as output data D140, one of the second data DATA2 or /DATA2 of the output terminal 30 of the to-be-tested on-chip logic 110-1 and the third data DATA3 of the second register block 130-3, to the second selection circuit 133, in response to the third selection signal SEL3.

The second selection circuit 133 outputs the output data D140 of the third selection circuit 140 or outputs data of the second inverter 134 to the first selection circuit 131 based on the second selection signal SEL2. The first selection circuit 131 transmits, as first data DATA1, a TDI signal TDI received via a TDI line 123-1 and outputs data of the second selection circuit 133, to the input terminal 20 of the to-be-tested on-chip logic 110-1, based on the first selection signal SEL1.

As described above, according to an activation timing and deactivation timing of the third selection signal SEL3, a part of the second data DATA2 of the output terminal 30 of the to-be-tested on-chip logic 110-1 may be changed to the third data DATA3.

Figure 5:
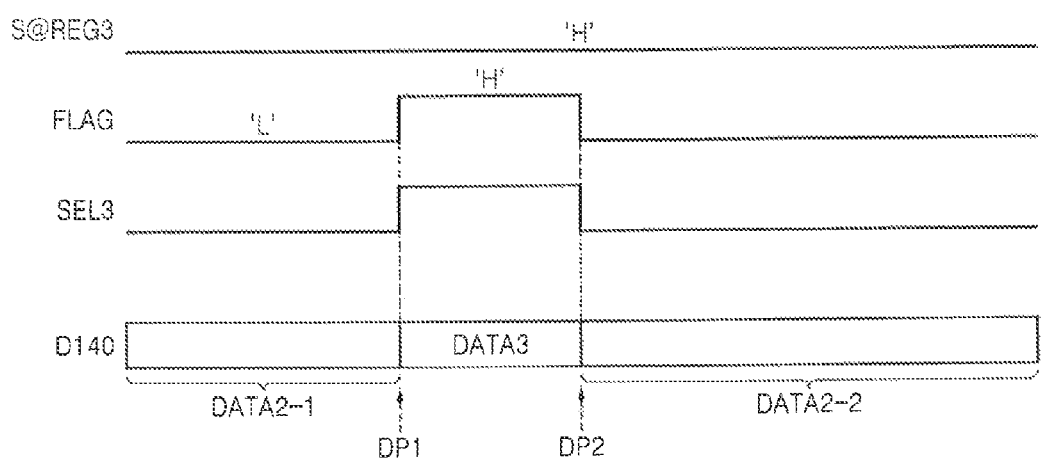
FIG. 5 is a diagram for describing an operation of the IC illustrated in FIG. 4, according to an exemplary embodiment of the inventive concept.

FIG. 5 is a diagram for describing an operation of the IC 100D of FIG. 4, according to an exemplary embodiment of the inventive concept. An operation of the comparator 137 operated based on change data programmed in the fourth register 141 will be described in detail with reference to FIGS. 3 through 5.

According to an exemplary embodiment of the inventive concept, 'DP1' may represent a start position of data that is to be changed, and 'DP2' may represent an end position of the data that is to be changed. According to an exemplary embodiment of the inventive concept, the DP2 may represent a size of the data that is to be changed.

For convenience of explanation, when the number of synchronizing circuits 101-1 through 101-$n$ implemented in the to-be-tested on-chip logic 110-1 is 100 and data to be stored in twentieth through thirty ninth synchronizing circuits 101-20 through 101-39 is desired to be changed, the DP1 may be set to 20, and the DP2 may be set to 39.

In addition, it is assumed that the to-be-tested on-chip logic 110-1 does not include a first inverter 111 the first selection signal SEL1 is at a high level, the second selection signal SEL2 is at a low level, and control data S@REG3 stored in the third register 139 is at a high level.

The counter 136 counts the period (or cycle) of the TCK signal TCK provided to the to-be-tested on-chip logic 110-1, and outputs the count value CNT corresponding to a result of the counting.

Until the count value CNT starts from '1' and reaches '20', the comparator 137 outputs a flag FLAG having a low level, and thus the logic circuit 138 outputs a third selection circuit SEL3 having a low level to the third selection circuit 140. Thus, since the third selection circuit 140 outputs a part DATA2-1 of the second data DATA2 as the output data D140, the part DATA2-1 of the second data DATA2 is fed back to the input terminal 20 of the to-be-tested on-chip logic 110-1 via each of the first and second selection circuits 131 and 133.

However, when the count value CNT reaches '20', the comparator 137 outputs a flag FLAG having a high level by using the DP1 (=20), and thus the logic circuit 138 outputs a third selection signal SEL3 having a high level to the third selection circuit 140.

Thus, since the third selection circuit 140 outputs a part of the third data DATA3, for example, a first bit, as the output data D140, the part of the third data DATA3, for example, the first bit, is transmitted to the input terminal 20 of the to-be-tested on-chip logic 110-1 via each of the first and second selection circuits 131 and 133.

Until the count value CNT reaches '40', the comparator 137 outputs a flag FLAG having a high level, and thus the logic circuit 138 outputs a third selection signal SEL3 having a high level to the third selection circuit 140. Thus, since the third selection circuit 140 outputs the rest of the third data DATA3, for example, a twentieth hit, as the output data D140, the rest of the third data DATA3, for example, the twentieth bit, is transmitted to the input terminal 20 of the to-be-tested on-chip logic 110-1 via each of the first and second selection circuits 131 and 133.

When the count value CNT reaches '40', the comparator 137 outputs a flag FLAG having a low level, and thus the logic circuit 138 outputs a third selection signal SEL3 having a low level as the output data D140 to the third selection circuit 140. Since the third selection circuit 140 outputs the rest DATA2-2 of the second data DATA2, as the output data D140, the rest DATA2-2 of the second data DATA2 is fed back to the input terminal 20 of the to-be-tested on-chip logic 110-1 via each of the first and second selection circuits 131 and 133.

For convenience of explanation, FIG. 5 illustrates the case where only one part of the second data DATA2 is changed to the third data DATA3. However, depending on how the change data IF is programmed in the fourth register 141, the second data DATA2 may be divided into at least three pieces.

FIG. 6 is a table showing selection conditions of signal paths illustrated in FIG. 4, according to an exemplary embodiment of the inventive concept. Referring to FIGS. 4 and 6, three feedback signal paths are formed between the output terminal 30 and the input terminal 20 of the to-be-tested on-chip logic 110-1.

According to the level of each of the first, second, and third selection signals SEL1, SEL2, and SEL3, the JTAG TAP controller 130D may select one of the three feedback signal paths. A signal path PATH1 may be selected when the first inverter 111 is not included in the to-be-tested on-chip logic 101-1. In other words, when the first selection signal SEL1 is set to a high level and each of the second and third selection signals SEL2 and SEL3 is set to a low level, the JTAG TAP controller 130D may select the signal path PATH1.

A signal path PATH2 may be selected when the first inverter 111 is included in the to-be-tested on-chip logic 101-1. In other words, when each of the first and second selection signals SEL1 and SEL2 is set to a high level and the third selection signal SEL3 is set to a low level, the JTAG TAP controller 130D may select the signal path PATH2.

A signal path PATH3 may be selected when a part of the second data DATA2 is changed to the third data DATA3. In other words, when each of the first and third selection signals SEL1 and SEL3 is set to a high level and the second selection signal SEL2 is set to a low level, the JTAG TAP controller 130D may select the signal path PATH3.

Regardless of the level of each of the second and third selection signals SEL2 and SEL3, when the level of the first selection signal SEL1 is at a low level, the TDI signal TDI of the TDI line 123-1 may be provided to the input terminal 20 via a signal path PATH4.

Figure 7:
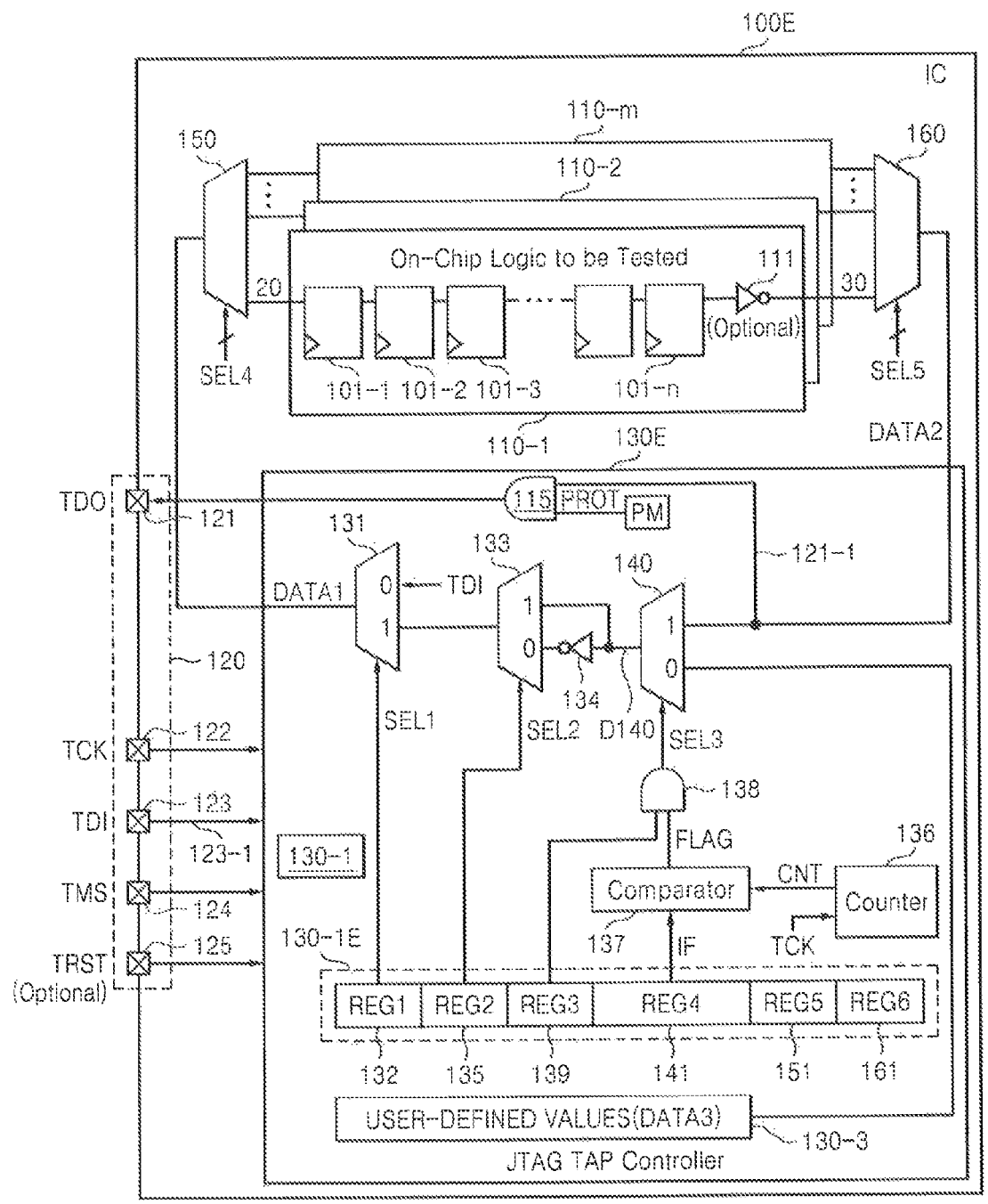
FIG. 7 is a block diagram of an IC including a JTAG TAP controller, according to an exemplary embodiment of the inventive concept.

FIG. 7 is a block diagram of an IC 100E including the JTAG TAP controller 130E, according to an exemplary embodiment of the inventive concept. Referring to FIG. 7, the IC 100E includes a plurality of to-be-tested on-chip logics 110-1 through 110-m (where m is a natural number equal to or greater than 2), a JTAG interface 120, the JTAG TAP controller 130E, a fourth selection circuit 150, and a fifth selection circuit 160.

The to-be-tested on-chip logics 110-1 through 110-m may respectively correspond to scan chains divided to test the internal logic circuits of the IC 100E.

Each of first, second, and third selection circuits 131, 133, and 140 and the sixth selection circuit 160 may be implemented by using a multiplexer, and the fourth selection circuit 150 may be implemented by using a de-multiplexer. The IC 100E may denote a SoC.

The JTAG TAP controller 130E may control an operation of each of the to-be-tested on-chip logics 110-1 through 110-m by using a TDO signal TDO, a TCK signal TCK, a TDI signal TDI, and a TMS signal TMS (and optionally, a TRST signal TRST). According to an exemplary embodiment of the inventive concept, each of the to-be-tested on-chip logics 110-1 through 110-m may or may not include a first inverter 111.

By using the signals TCK, TDI, and/or TMS received via the JTAG interface 120, a control logic 130-1 may set data associated with a first selection signal SEL1 in a first register 132, may set data associated with a second selection signal SEL2 in a second register 135, may set data associated with the generation of a third selection signal SEL3 in a third register 139, may set in a fourth register 141 change data that represents at least one of a size and position of data that is to be changed (or to be replaced), may set data associated with the generation of a fourth selection signal SEL4 in a fifth register 151, and may set data associated with the generation of a fifth selection signal SEL5 in a sixth register 161.

A first register block 130-1E includes the first, second, third, fourth, fifth, and sixth registers 132, 135, 139, 141, 151, and 161. Each of the first, second, third, fourth, fifth, and sixth registers 132, 135, 139, 141, 151, and 161 may store one or more bits. The control logic 130-1 may store user-defined data, for example, third data DATA3, in a second register block 130-3 by using the signals TCK, TDI, and/or TMS received via the JTAG interface 120.

According to the number of to-be-tested on-chip logics 110-1 through 110-m, the number of bits to be included in each of the fourth and fifth selection signals SEL4 and SEL5 may be determined.

The fourth selection circuit 150 may connect an output terminal of the first selection circuit 131 with an input terminal 20 of one of the to-be-tested on-chip logics 110-1 through 110-m, based on the fourth selection signal SEA including one or more bits. The fifth selection circuit 160 may connect an output terminal 30 of one of the to-be-tested on-chip logics 110-1 through 110-m with a TDO line 121-1, based on the fifth selection signal SEL5 including one or more bits.

Change data about to-be-changed data from among pieces of data being processed in each of the to-be-tested on-chip logics 110-1 through 110-m may be stored in the fourth register 141. In this case, to-be-changed data in each of the to-be-tested on-chip logics 110-1 through 110-m may be stored in the second register block 130-3. An operation of the JTAG TAP controller 130E is substantially the same as that of the JTAG TAP controller 130D of FIG. 4.

Figure 8:
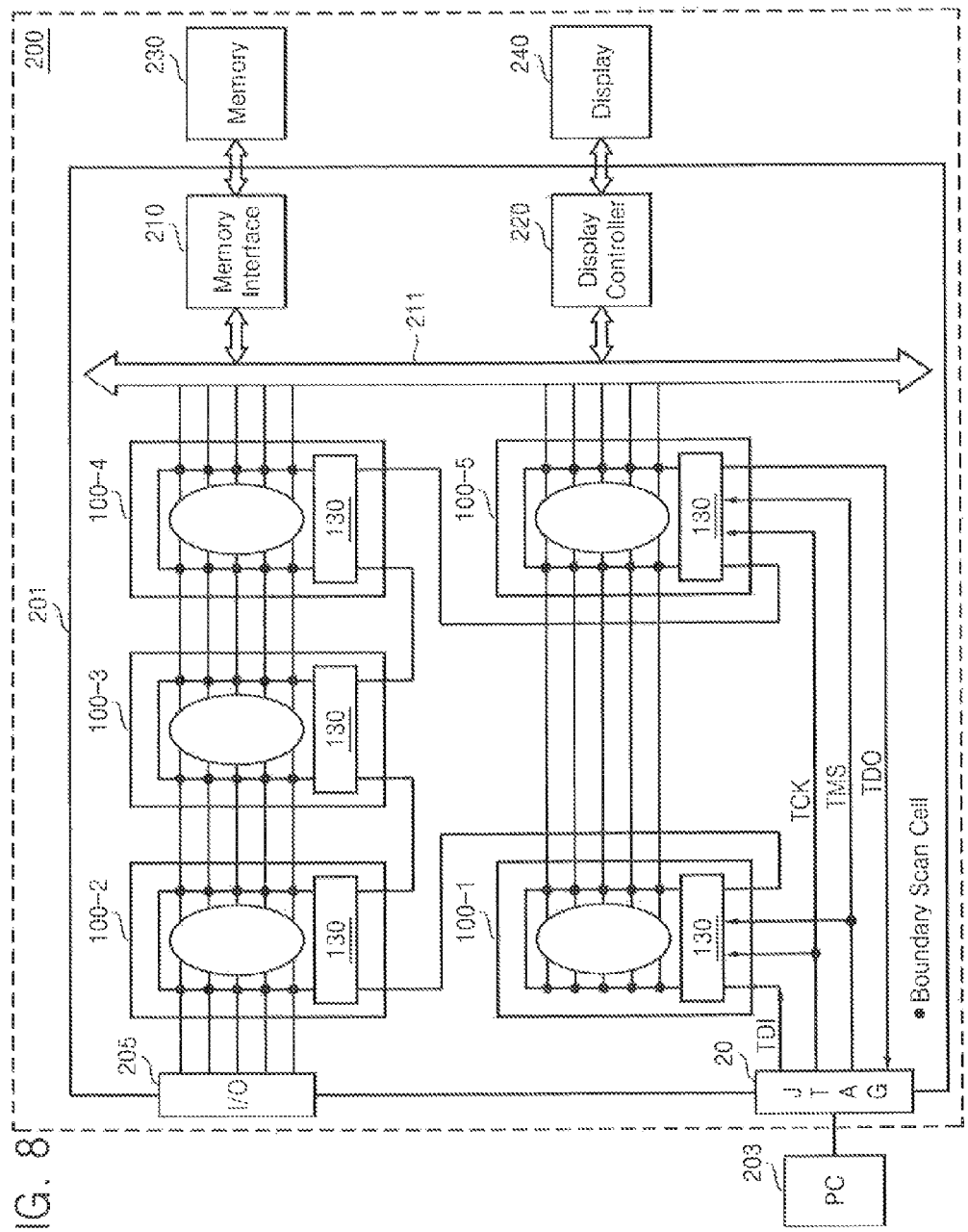
FIG. 8 is a block diagram of an electronic system including the IC illustrated in FIG. 1, 2, 3, 4, or 7, according to an exemplary embodiment of the inventive concept.

FIG. 8 is a block diagram of an electronic system 200 including the IC 100A, 100B, 100C, 100D, or 100E illustrated in FIG. 1, 2, 3, 4, or 7, according to an exemplary embodiment of the inventive concept. Referring to FIG. 8, the electronic system 200 includes an IC 201, a memory 230, and a display 240. For convenience of explanation, in FIG. 8, a personal computer (PC) 203 is illustrated as a debugging device or debugger capable of debugging the electronic system 200, but this is only an example.

The PC 203 may program the first register block 130-1C, 130-1D, or 130-1E and the second register block 130-3 via a JTAG interface 20, and may monitor a TDO signal TDO output via the JTAG interface 20.

The electronic system 200 may be implemented by using a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internee device (MID), or an e-book.

According to an exemplary embodiment of the inventive concept, the IC 201 may denote a SoC or a printed circuit board (PCB). According to an exemplary embodiment of the inventive concept, the IC 201 may denote an application processor (AP), a mobile AP, or a semiconductor package.

The IC 201 includes the JTAG interface 20, an input/output (I/O) port 205, one or more ICs, for example, ICs 100-1 through 100-5, a memory interface 210, a bus 211, and a display controller 220. The IC 201 may be scanned or debugged via the JTAG interface 20. In addition, the IC 201 may process data received via the I/O port 205 or transmit processed data to an external device via the I/O port 205.

Each of the ICs 100-1 through 100-5 may be one of the above-described ICs 100A through 100E. One of the ICs 100-1 through 100-5 may be a central processing unit (CPU) or a multi-core processor. A JTAG TAP controller 130 included in each of the ICs 100-1 through 100-5 may be one of the above-described JTAG TAP controllers 130A through 130E. Each of the ICs 100-1 through 100-5 includes a plurality of boundary scan cells, and the boundary scan cells of each of the ICs 100-1 through 100-5 may be connected with each other. For example, the ICs 100-1 through 100-5 included in the IC 201 may be connected with each other in the form of a daisy chain.

The memory interface 210 may exchange data and/or commands with the memory 230 under the control of the CPU or the multi-core processor. The memory 230 may be implemented by using a volatile memory or a non-volatile memory. Each of the ICs 100-1 through 100-5 may exchange data and/or commands with the memory interface 210 and the display controller 220 via the bus 211. The display controller 220 may transmit display data to the display 240 under the control of the CPU or the multi-core processor.

Figure 9:
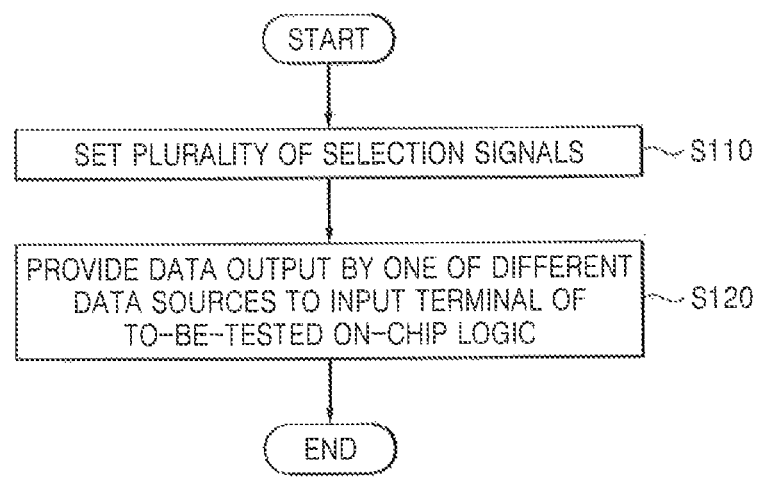
FIG. 9 is a flowchart of an operation of the IC illustrated in FIG. 1, 2, 3, 4, or 7, according to an exemplary embodiment of the inventive concept.

FIG. 9 is a flowchart of an operation of the IC 100A, 100B, 100C, 100D, 100E, or 100-1 through 100-5 of FIG. 1, 2, 3, 4, 7 or 8, according to an exemplary embodiment of the inventive concept. The IC 100A, 100B, 100C, 100D, 100E, or each of the ICs 100-1 through 100-5 (collectively, referred to as an IC 100) includes a to-be-tested on-chip logic 110-1 including an input terminal 20, an output terminal 30 connected to a TDO line 121-1, and a plurality of synchronizing circuits 101-1 through 101-n connected in a scan-chain. An operation thereof will now be described in detail with reference to FIG. 1, 2, 3, 4, 7 or 8.

In operation S110, the control logic 130-1 sets one or at least two of the first through fifth selection signals SEL1 through SEL5 corresponding to the first register block 130-1C, 130-1D, or 130-1E by using the signals TCK, TDI, and/or TMS received via the JTAG interface 20.

In operation S120, the JTAG TAP controller 130 connects to the input terminal 20 of the to-be-tested on-chip logic 110-1 one of a first signal path transmitting the TDI signal TDI, a second signal path transmitting data associated with the output data of the output terminal 20 of the to-be-tested on-chip logic 110-1, and a third signal path transmitting user-defined data, in response to one or more of the first through fifth selection signals SEL1 through SEL5. For example, the second signal path may include a signal path transmitting data having the same phase as the output data of the output terminal 20 of the to-be-tested on-chip logic 110-1 or a signal path transmitting data having a different phase from the output data of the output terminal 20 of the to-be-tested on-chip logic 110-1.

Figure 10:
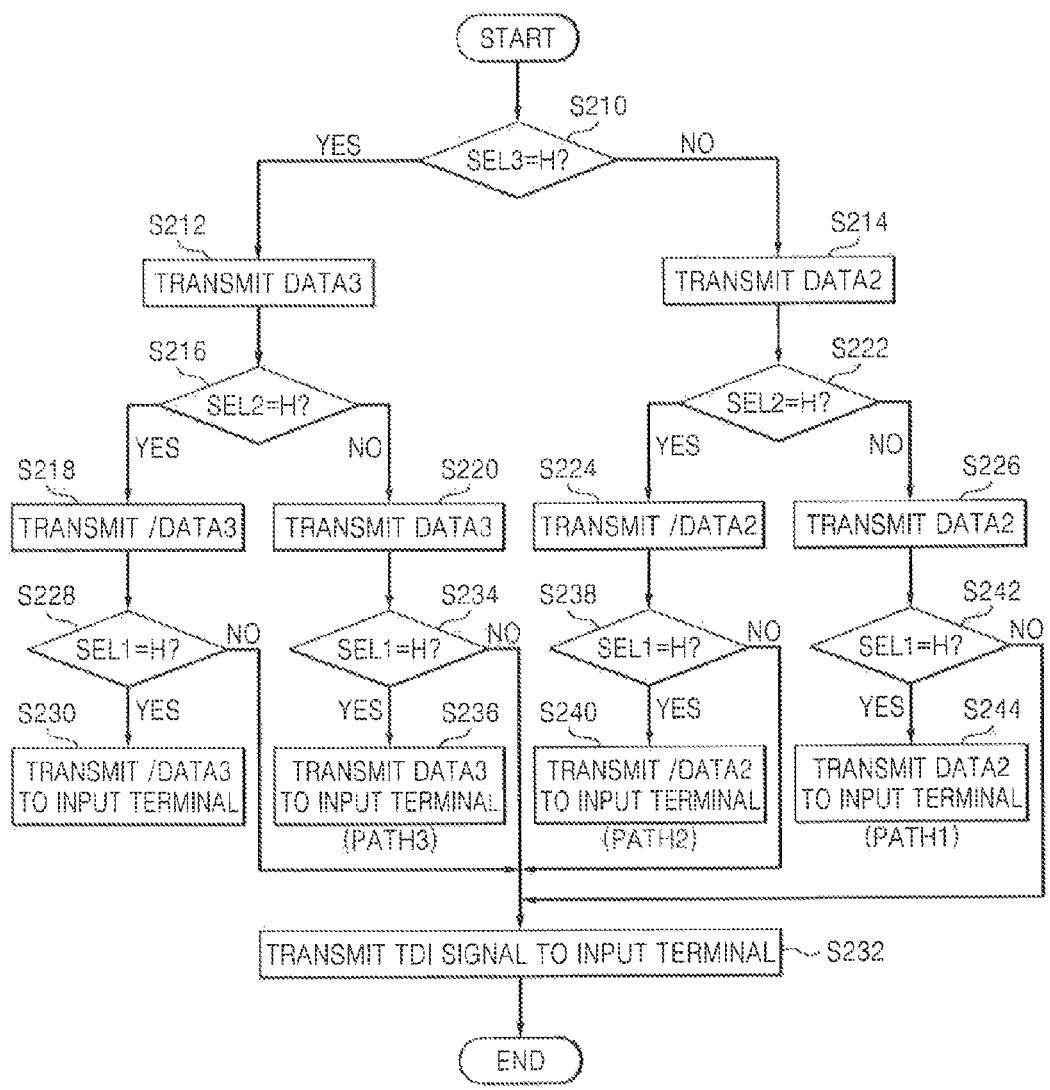
FIG. 10 is a flowchart of an operation of the IC illustrated in FIG. 4 or 7, according to an exemplary embodiment of the inventive concept.

FIG. 10 is a flowchart of an operation of the IC 110D or 100E illustrated in FIG. 4 or 7, according to an exemplary embodiment of the inventive concept. Referring to FIGS. 4, 6, 7, and 10, when it is determined in operation S210 that the third selection signal SEL3 is at a high level, the third selection circuit 140 transmits the third data DATA3 output by the second register block 130-3, in operation S212.

When it is determined in operation S216 that the second selection signal SEL2 is at a high level, the second selection circuit 133 transmits inverted third data /DATA3 obtained by the second inverter 134, in operation S218. When it is determined in operation S228 that the first selection signal SEL1 is at a high level, the first selection circuit 131 transmits the inverted third data /DATA3 to the input terminal 20 of the to-be-tested on-chip logic 110-1, in operation S230. When it is determined in operation S228 that the first selection signal SEL1 is at a low level, the first selection circuit 131 transmits the TDI signal TDI of the TDI line 123-1 to the input terminal 20 of the to-be-tested on-chip logic 110-1, in operation S232.

When it is determined in operation S216 that the second selection signal SEL2 is at a low level, the second selection circuit 133 transmits the third data DATA3, in operation S220. When it is determined in operation S234 that the first selection signal SEL1 is at a high level, the first selection circuit 131 transmits the third data DATA3 to the input terminal 20 of the to-be-tested on-chip logic 110-1, in operation S236. This may be considered the third path PATH3. When it is determined in operation S234 that the first selection signal SEL1 is at a low level, the first selection circuit 131 transmits the TDI signal TDI of the TDI line 123-1 to the input terminal 20 of the to-be-tested on-chip logic 110-1, in operation S232.

When it is determined in operation S210 that the third selection signal SEL3 is at a low level, the third selection circuit 140 transmits the second data DATA2, in operation S214. When it is determined in operation S222 that the selection signal SEL2 is at a high level, the second selection circuit 133 transmits the inverted second data /DATA2 obtained by the second inverter 134, in operation S224.

When it is determined in operation S238 that the first selection signal SEL1 is at a high level, the first selection circuit 131 transmits the inverted second data /DATA2 to the input terminal 20 of the to-be-tested on-chip logic 110-1, in operation S240. This may be considered the second path PATH2. When it is determined in operation S238 that the first selection signal SEL1 is at a low level, the first selection circuit 131 transmits the TDI signal TDI of the TDI line 123-1 to the input terminal 20 of the to-be-tested on-chip logic 110-1, in operation S232. When it is determined in operation S222 that the second selection signal SEL2 is at a low level, the second selection circuit 133 transmits the second data DATA2, in operation S226.

When it is determined in operation S242 that the first selection signal SEL1 is at a high level, the first selection circuit 131 transmits the second data DATA2 to the input terminal 20 of the to-be-tested on-chip logic 110-1, in operation S244. This may be considered the first path PATH1. When it is determined in operation S242 that the first selection signal SEL1 is at a low level, the first selection circuit 131 transmits the TDI signal TDI of the TDI line 123-1 to the input terminal 20 of the to-be-tested on-chip logic 110-1, in operation S232.

Figure 11:
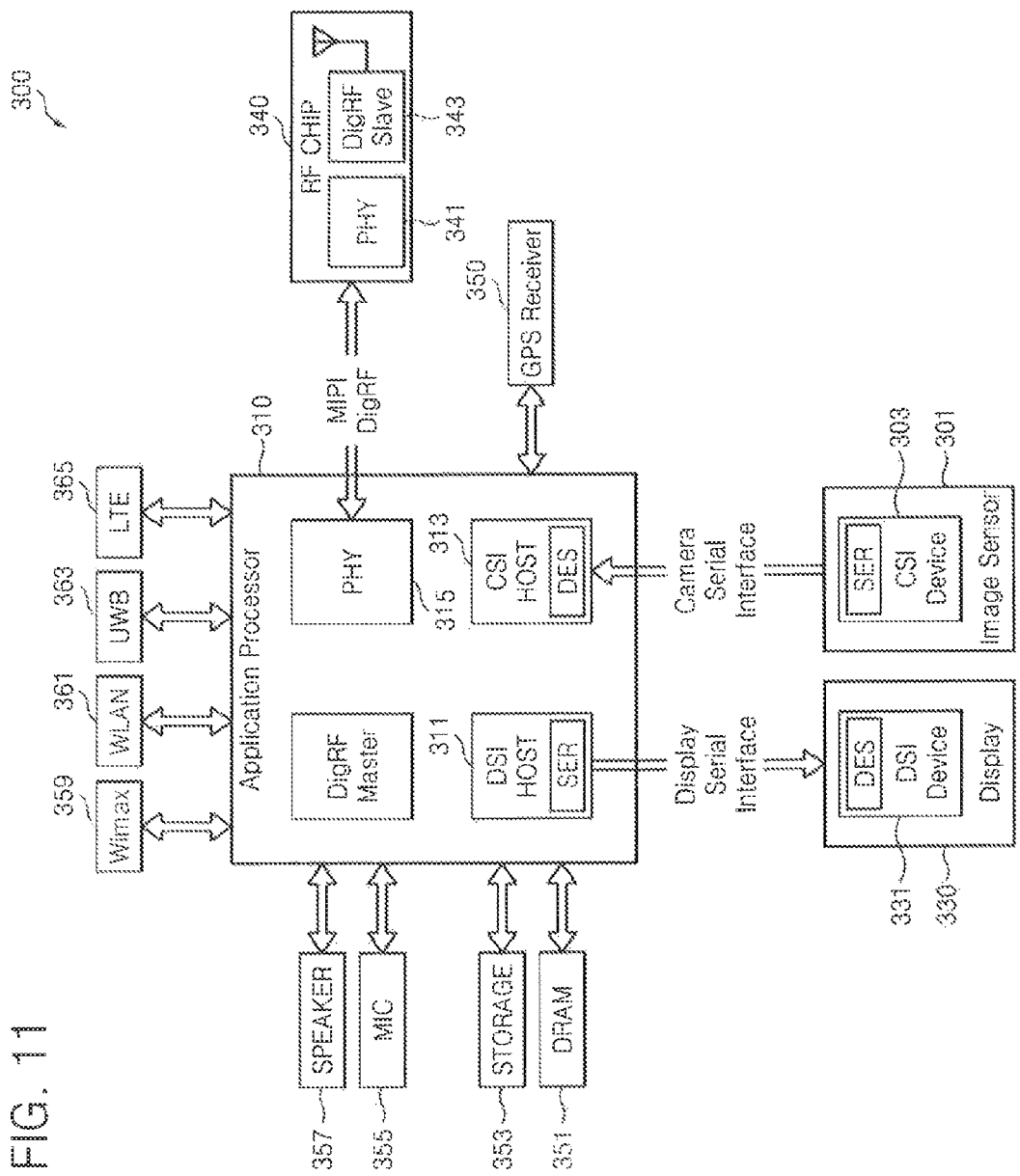
FIG. 11 is a block diagram of an electronic system including the IC illustrated in FIG. 1, 2, 3, 4, 7, or 8, according to an exemplary embodiment of the inventive concept.

FIG. 11 is a block diagram of an electronic system 300 including the IC 100A, 100B, 100C, 100D, 100E, or 100 of FIG. 1, 2, 3, 4, 7, or 8, according to an exemplary embodiment of the inventive concept. The electronic system 300 may be implemented by using a portable electronic device capable of using or supporting a mobile industry processor interface (MIPI). The portable electronic device may be a smart phone, a tablet PC, or a mobile internet device.

The electronic system 300 includes an AP 310, an image sensor 301, and a display 330. The AP 310 of FIG. 11 may further include the components 20, 100-1 through 100-5, 210, 211, and 220 included in the IC 201 illustrated in FIG. 8.

A camera serial interface (CSI) host 313 implemented in the AP 310 may serially communicate with a CSI device 303 of the image sensor 301 via a CSI. According to an exemplary embodiment of the inventive concept, a deserializer DES may be implemented in the CSI host 313, and a serializer SER may be implemented in the CSI device 303.

A display serial interface (DSI) host 311 implemented in the AP 310 may serially communicate with a DSI device 331 of the display 330 via a DSI.

According to an exemplary embodiment of the inventive concept, a serializer SER may be implemented in the DSI host 311, and a deserializer DES may be implemented in the DSI device 331. Each of the deserializer DES and the serializer SER may process an electrical signal or an optical signal.

The electronic system 300 may further include a radio frequency (RF) chip 340 capable of communicating with the AP 310. A physical layer (PRY) 315 of the AP 310 and a PHY 341 of the RF chip 340 may exchange data according to MIDI DigRF. The RF chip 340 may further include a DigRF slave 343 connected to an antenna.

The electronic system 300 may further include a global positioning system (GPS) receiver 350, a memory 351 such as a dynamic random access memory (DRAM), a data storage device 353 implemented by a non-volatile memory such as a NAND flash memory, a microphone (MIC) 355, or a speaker 357.

The electronic system 300 may communicate with an external apparatus by using at least one communication protocol (or a communication standard), for example, worldwide interoperability for microwave access (WiMAX) 359, a wireless local area network (WLAN) 361, an ultra-wideband (UWB) 363, or a long term evolution (LTE™) 365.

The electronic system 300 may communicate with an external wireless communication device by using Bluetooth or WiFi.

When an IC according to an exemplary embodiment of the inventive concept is in a malfunction or hung-up state, a JTAG TAP controller built in the IC may transmit data shifted-out of a to-be-tested on-chip logic to a debugger via a TDO pin and simultaneously may re-load the data to the to-be-tested on-chip logic or change a part of the data to user-defined data.

Thus, the IC does not include a separate storage device or emulator for re-loading data output by the to-be-tested on-chip logic to the to-be-tested on-chip logic.

Further, since the JTAG TAP controller built in the IC according to an exemplary embodiment of the inventive concept may re-load data shifted out of a to-be-tested on-chip logic to the to-be-tested on-chip logic, a debugging time for the IC may be reduced. Moreover, since the JTAG TAP controller built in the IC may change a part of the data shifted out of the to-be-tested on-chip logic to user-defined data, a debugging efficiency for the IC may be increased.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. An integrated circuit (IC), comprising:
    an on-chip logic that includes an input terminal, an output terminal, and a plurality of sequentially-connected synchronizing circuits connected in a scan-chain between the input terminal and the output terminal;
    a test data in (TDI) line;
    a test data out (TDO) line connected to the output terminal;
    a test access port (TAP) controller that transmits, to the input terminal, data output from one of a plurality of data sources including the TDI line and the output terminal, in response to one or more selection signals;
    a programmable memory that stores a control signal; and
    a mask circuit that controls a connection between the TDO line and a TDO pin based on the control signal output from the programmable memory.

2. The IC of claim 1, wherein the TAP controller inverts the data output from the output terminal and feeds the inverted data back to the input terminal.

3. The IC of claim 1, wherein the TAP controller comprises a register block that stores user-defined data, and the data sources further include the register block.

4. The IC of claim 3, wherein the TAP controller changes a part of the data output from the output terminal to the user-defined data.

5. The IC of claim 1, wherein the TAP controller comprises one or more registers that store one or more programmable selection signals.

6. The IC of claim 1, wherein, when the one selection signal is a first selection signal, the TAP controller comprises a selection circuit that controls a connection between the input terminal and one of the TDI line and the output terminal based on the first selection signal.

7. The IC of claim 1, wherein, when the selection signals comprise a first selection signal and a second selection signal and a first inverter is disposed between a last synchronizing circuit from among the plurality of synchronizing circuits and the output terminal, the TAP controller comprises:
    a second inverter connected to the output terminal;
    a second selection circuit that outputs the data output from the output terminal or output data of the second inverter based on the second selection signal; and
    a first selection circuit that controls a connection between the input terminal and one of the TDI line and an output terminal of the second selection circuit based on the first selection signal.

8. The IC of claim 1, wherein, when the selection signals comprise a first selection signal and a second selection signal, the TAP controller comprises:
    a register block that stores user-defined data;
    a second selection circuit that outputs the data output from the output terminal or the user-defined data based on the second selection signal; and
    a first selection circuit that controls a connection between the input terminal and one of the TDI line and an output terminal of the second selection circuit based on the first selection signal.

9. The IC of claim 8, wherein the TAP controller further comprises:
    a change data register that stores change data associated with changing a part of the data output from the output terminal to the user-defined data when a change occurs;
    a counter that counts a cycle of a test clock (TCK) signal provided to the on-chip logic via a Joint Test Action Group (JTAG) interface and outputs a count value corresponding to a result of the counting;
    a comparator that compares a reference value associated with the change data with the count value and outputs a flag corresponding to a result of the comparison;
    a register that stores control data about the second selection circuit; and
    a selection signal generator that generates the second selection signal by performing a logic operation on the flag and the control data.

10. The IC of claim 1, wherein, when the selection signals comprise a first selection signal, a second selection signal, and a third selection signal, the TAP controller comprises:
a register block that stores user-defined data;
a third selection circuit that outputs the data output from the output terminal or the user-defined data based on the third selection signal;
an inverter connected to an output terminal of the third selection circuit;
a second selection circuit that outputs output data of the third selection circuit or output data of the inverter based on the second selection signal; and
a first selection circuit that controls a connection between the input terminal and one of the TDI line and an output terminal of the second selection circuit based on the first selection signal.

11. The IC of claim 10, wherein the TAP controller further comprises:
a change data register that stores change data associated with changing a part of the data output from the output terminal to the user-defined data when a change occurs;
a counter that counts a cycle of a test clock (TCK) signal provided to the on-chip logic via a Joint Test Action Group (JTAG) interface and outputs a count value corresponding to a result of the counting;
a comparator that compares a reference value associated with the change data with the count value and outputs a flag corresponding to a result of the comparison;
a register that stores control data about the second selection circuit; and
a selection signal generator that generates the third selection signal by performing a logic operation on the flag and the control data.

12. A computer system, comprising:
an application processor (AP);
a memory that communicates with the AP;
a display that communicates with the AP;
wherein the AP comprises:
a central processing unit (CPU);
a memory interface that communicates with the memory under the control of the CPU;
a display controller that controls an operation of the display under the control of the CPU, and wherein the CPU comprises:
an on-chip logic that comprises an input terminal, an output terminal, and a plurality of sequentially-connected synchronizing circuits connected in a scan-chain between the input terminal and the output terminal;
a test data in (TDI) line;
a test data out (TDO) line connected to the output terminal;
a test access port (TAP) controller that connects one of a plurality of data sources, the data sources comprising the TDI line and the output terminal, to the input terminal in response to one or more selection signals;
a programmable memory that stores a control signal; and
a mask circuit that controls a connection between the TDO line and a TDO pin based on the control signal output from the programmable memory.

13. The computer system of claim 12, wherein, when the selection signals comprise a first selection signal, a second selection signal, and a third selection signal, the TAP controller comprises:
a register block that stores user-defined data;
a third selection circuit that outputs output data of the output terminal or the user-defined data based on the third selection signal;
an inverter connected to an output terminal of the third selection circuit;
a second selection circuit that outputs output data of the third selection circuit or output data of the inverter based on the second selection signal; and
a first selection circuit that controls a connection between the input terminal and one of the TDI line and an output terminal of the second selection circuit based on the first selection signal.

14. The computer system of claim 13, wherein the TAP controller further comprises:
a change data register that stores change data associated with changing a part of the output data of the output terminal to the user-defined data when a change occurs;
a counter that counts a cycle of a test clock (TCK) signal provided to the on-chip logic via a Joint Test Action Group (JTAG) interface and outputs a count value corresponding to a result of the counting;
a comparator that compares a reference value associated with the change data with the count value and outputs a flag corresponding to a result of the comparison;
a register that stores control data about the second selection circuit; and
a selection signal generator that generates the third selection signal by performing a logic operation on the flag and the control data.

15. The computer system of claim 12, wherein the TAP controller comprises a register block that stores user-defined data, and the plurality of data sources further comprise the register block.

16. The computer system of claim 15, wherein the TAP controller changes a part of output data of the output terminal to the user-defined data.

17. A method of operating an integrated circuit (IC), the IC comprising an on-chip logic that comprises an input terminal, an output terminal connected to a test data output (TDO) line, and a plurality of sequentially-connected synchronizing circuits connected in a scan-chain between the input terminal and the output terminal, the method comprising:
setting a plurality of selection signals; and
connecting to the input terminal one of a first path that transmits test data in (TDI) data received via a TDI line, a second path that transmits data associated with output data of the output terminal, and a third path that transmits user-defined data, in response to the plurality of selection signals,
wherein the IC comprises:
a programmable memory that stores a control signal; and
a mask circuit that controls a connection between the TDO line and a TDO pin based on the control signal output from the programmable memory.

18. The method of claim 17, wherein a phase of data associated with the output data fed back to the input terminal via the second path is the same as or different from that of the output data of the output terminal.

* * * * *